(12) United States Patent
Nagata et al.

(10) Patent No.: US 8,931,506 B2
(45) Date of Patent: Jan. 13, 2015

(54) GAS SUPPLY APPARATUS EQUIPPED WITH VAPORIZER

(75) Inventors: Atsushi Nagata, Nirasaki (JP); Masaaki Nagase, Osaka (JP); Atsushi Hidaka, Osaka (JP); Kaoru Hirata, Osaka (JP); Atsushi Matsumoto, Osaka (JP); Kouji Nishino, Osaka (JP); Ryousuke Dohi, Osaka (JP); Nobukazu Ikeda, Osaka (JP)

(73) Assignee: Fujikin Incorporated, Osaka (JP)

( * ) Notice: Subject to any disclaimer, the term of this patent is extended or adjusted under 35 U.S.C. 154(b) by 1140 days.

(21) Appl. No.: 12/935,870

(22) PCT Filed: Feb. 17, 2009

(86) PCT No.: PCT/JP2009/000643
§ 371 (c)(1),
(2), (4) Date: Dec. 27, 2010

(87) PCT Pub. No.: WO2009/122646
PCT Pub. Date: Oct. 8, 2009

(65) Prior Publication Data
US 2011/0100483 A1 May 5, 2011

(30) Foreign Application Priority Data

Apr. 1, 2008 (JP) ................................ 2008-094640

(51) Int. Cl.
*F16K 49/00* (2006.01)
*B01J 4/02* (2006.01)
(Continued)

(52) U.S. Cl.
CPC . *B01J 4/02* (2013.01); *B01B 1/005* (2013.01); *C23C 16/4481* (2013.01); *C23C 16/4485* (2013.01); *C23C 16/45561* (2013.01);
(Continued)

(58) Field of Classification Search
CPC . F16K 49/00; F16K 49/002; C23C 16/45514; C23C 16/45512; C23C 16/4486

USPC ................. 137/334, 341; 118/715, 726, 724; 261/141, 142
See application file for complete search history.

(56) References Cited

U.S. PATENT DOCUMENTS 5,050,570 A * 9/1991 Thring ........................... 123/556
5,630,878 A * 5/1997 Miyamoto et al. ............ 118/715
(Continued)

FOREIGN PATENT DOCUMENTS

JP  08-338546   12/1996
JP  11-278987   10/1999
(Continued)

OTHER PUBLICATIONS

International Search Report issued in corresponding Japanese Application No. PCT/JP2009/000643, completed Mar. 19, 2009, mailed Mar. 31, 2009.

(Continued)

*Primary Examiner* — Kevin Murphy
(74) *Attorney, Agent, or Firm* — Griffin & Szipl, P.C.

(57) ABSTRACT

An energy-saving, downsized gas supply apparatus equipped with a vaporizer is provided, wherein the gas supply apparatus is capable of stably and easily performing highly accurate gas flow rate control without requiring rigorous temperature control on the vaporizer side. The present invention pertains to a gas supply apparatus equipped with a vaporizer that includes (a) a liquid receiving tank; (b) a vaporizer that vaporizes liquid; (c) a high-temperature type pressure type flow rate control device that adjusts a flow rate of a vaporized gas; and (d) heating devices that heat the vaporizer, the high-temperature type pressure type flow rate control device, and desired portions of pipe passages connected to the vaporizer and the high-temperature type pressure type flow rate control device.

15 Claims, 11 Drawing Sheets

(51) Int. Cl.
*B01B 1/00* (2006.01)
*C23C 16/448* (2006.01)
*C23C 16/455* (2006.01)
*F02M 21/06* (2006.01)
*F02M 21/02* (2006.01)
*F02D 19/02* (2006.01)

(52) U.S. Cl.
CPC .......... *F02M 21/06* (2013.01); *F02M 21/0239* (2013.01); *F02D 19/023* (2013.01); *F02D 19/027* (2013.01); *B01J 2219/00162* (2013.01); *B01J 2219/00164* (2013.01); *B01J 2219/00191* (2013.01); *B01J 2219/00198* (2013.01); *B01J 2219/00213* (2013.01); *B01J 2219/00231* (2013.01); *Y02T 10/32* (2013.01)
USPC ............................ 137/341; 137/334; 118/726

(56) References Cited

U.S. PATENT DOCUMENTS

| | | | |
|---|---|---|---|
| 6,039,809 A * | 3/2000 | Toyama et al. | 118/715 |
| 6,126,994 A * | 10/2000 | Murakami et al. | 427/248.1 |
| 6,206,971 B1 * | 3/2001 | Umotoy et al. | 118/715 |
| 6,210,485 B1 * | 4/2001 | Zhao et al. | 118/724 |
| 2004/0204794 A1 * | 10/2004 | Ohmi et al. | 700/282 |
| 2005/0229972 A1 * | 10/2005 | Hoshi et al. | 137/341 |
| 2005/0249874 A1 * | 11/2005 | Hoshino et al. | 427/248.1 |
| 2006/0032444 A1 * | 2/2006 | Hara | 118/715 |

FOREIGN PATENT DOCUMENTS

| | | |
|---|---|---|
| JP | 99/53117 A2 | 10/1999 |
| JP | 2001-148347 A | 5/2001 |
| JP | 2001-185492 A | 7/2001 |
| JP | 2002-511529 A | 4/2002 |
| JP | 2003142473 | 5/2003 |
| JP | 2003-268552 A | 9/2003 |
| JP | 2003-332327 A | 11/2003 |
| JP | 2004-143591 | 5/2004 |
| JP | 2004-535061 A | 11/2004 |
| JP | 2005-256107 A | 9/2005 |
| JP | 2006222136 A | 8/2006 |
| JP | 2007-036265 | 2/2007 |
| WO | 02/097870 A2 | 12/2002 |

OTHER PUBLICATIONS

SCCM—What does SCCM Stand for? . . . downloaded from www.acronyms.thefreedictionary.com/SCCM.

Japanese Patent No. 2002511529, dated Apr. 16, 2002, part 1, (submitted in part 1 due to large document size).

Japanese Patent No. 2002511529, dated Apr. 16, 2002, part 2, (submitted in part 2 due to large document size).

* cited by examiner

GAS SUPPLY APPARATUS EQUIPPED WITH VAPORIZER

This is a National Phase Application in the United States of International Patent Application No. PCT/JP2009/000643 filed Feb. 17, 2009, which claims priority on Japanese Patent Application No. 2008-094640, filed Apr. 1, 2008. The entire disclosures of the above patent applications are hereby incorporated by reference.

FIELD OF THE INVENTION

The present invention relates to improvements in a gas supply apparatus equipped with a vaporizer used for semiconductor manufacturing devices, chemical industrial facilities, medical industrial facilities, and the like, and relates to a gas supply apparatus equipped with a vaporizer having a simple structure, which makes possible energy saving and downsizing of the unit. The unit is capable of easily performing temperature management and flow rate control by combining a vaporizer and a high-temperature type pressure type flow rate control device to make use of the stable flow rate control characteristics of the pressure type flow rate control device.

BACKGROUND OF THE INVENTION

For semiconductor manufacturing facilities, many gas supply systems have been conventionally used in which various types of liquefied gases for semiconductor manufacturing are received into their tanks and are gasified by their vaporizers, and then are supplied to process chambers. For example, FIG. 12 shows an example of a basic configuration of a gas supply apparatus composed of a vaporizer Va and a liquid type thermal mass flow rate control device LMFC. The gas supply apparatus is configured so that a liquefied gas LG, received in a liquefied gas receiving tank T, is fed to the vaporizer Va by use of the pressure of a gas Gp for pressurizing or by the use of a pump for feeding liquid (not shown), while controlling its flow rate by the liquid type thermal mass flow rate control device LMFC, in order to supply a vaporized gas G at a predetermined flow rate to a process chamber CH. In addition, reference character H is a heating region.

Meanwhile, because the liquid type thermal mass flow rate control device LMFC is used for the gas supply apparatus of FIG. 12, there is the problem that an error in a vaporized gas flow rate becomes inevitably large even when an error in flow rate control in a liquid state is small. This makes it difficult to accurately control gas flow rate.

Therefore, as shown in FIG. 13, a gas supply apparatus of a type in which a high-temperature type thermal mass flow rate control device HMFC is connected to the downstream side of the vaporizer Va has been developed to make an attempt to perform highly accurate mass flow rate control of a vaporized gas G. However, because the high-temperature type thermal mass flow rate control device HMFC has the characteristic that controlling flow rate is greatly changed according to fluctuation of a primary side flow rate and pressure, it is necessary to maintain a secondary side flow rate and pressure of the vaporizer Va at predetermined setting values by highly accurately performing temperature control on the side of the vaporizer Va in order to perform highly accurate flow rate control for the gas flow rate. Furthermore, it is necessary to set a temperature of its sensor portion to be higher than a temperature of its main line in the high-temperature type thermal mass flow rate control device HMFC, which may easily bring about decomposition and deposition of the liquid source (material).

On the other hand, in order to highly accurately maintain the secondary side of the vaporizer Va at a predetermined flow rate and pressure, it is necessary to highly accurately perform temperature control of the vaporizer Va as described above and, as a result, it is necessary to increase a heating volume and enlarge a heating region. Therefore, not only is the gas supply apparatus itself increased in size by necessity, but also various inconveniences are brought about in terms of energy saving, operating cost, and the like.

[Patent Document 1] Japanese Published Unexamined Patent Application No. H11-278987
[Patent Document 2] Japanese Published Unexamined Patent Application No. 2003-142473
[Patent Document 3] Japanese Published Unexamined Patent Application No. 2004-143591
[Patent Document 4] Japanese Published Unexamined Patent Application No. 2007-036265

Problems to be Solved by the Invention

The present invention has been constructed in order to solve the problems described above in a gas supply apparatus according to a combination of a conventional liquid type thermal mass flow rate control device LMFC and a vaporizer Va, or a combination of the vaporizer Va and a high-temperature type thermal mass flow rate control device as follows: (a) in the case where a liquid type thermal mass flow rate control device is used, even a small error in the amount of liquid leads to a great error in gas volume due to its expansion, which makes it impossible to perform accurate flow rate control of a liquefied gas G; and (b) in the case where a high-temperature type thermal mass flow rate control device HMFC is used, highly accurate temperature control of the vaporizer Va is required, which results in an increase in size of the gas supply apparatus or results in making the temperature control device complex. An object of the present invention is to provide a gas supply apparatus equipped with a vaporizer in which the vaporizer Va and a high-temperature type pressure type flow rate control device HFCS are combined in a manner that is capable of performing highly accurate flow rate control of a vaporized gas G with so-called "rough temperature" control and flow rate control, and a downsized gas supply apparatus without requiring specific highly accurate temperature control and flow rate control.

SUMMARY OF THE INVENTION

In order to achieve the object(s) of the invention, the invention, according to a first embodiment, has the basic configuration of a gas supply apparatus equipped with a vaporizer including: a liquid receiving tank; a vaporizer that vaporizes liquid pressure-fed from the liquid receiving tank; a high-temperature type pressure type flow rate control device that adjusts a flow rate of outflow gas from the vaporizer; and heating devices that heat the vaporizer, the high-temperature type pressure type flow rate control device, and desired portions of pipe passages connected to the vaporizer and the high-temperature type pressure type flow rate control device.

The invention, according to a second embodiment, is that in the invention according to the first embodiment, the liquid is any one of water ($H_2O$), hydrogen fluoride (HF), tetraethoxysilane (TEOS), trimethylaluminum (TMA), or tetrakis (diethylamino)hafnium (TDEAH).

The invention according to a third embodiment is that, in the invention according to the first embodiment, a device main body of the high-temperature type pressure type flow rate control device is mounted on a vaporizing chamber of the vaporizer.

The invention according to a fourth embodiment further includes, in the invention according to the first embodiment, a liquid supply control device that adjusts an amount of liquid to be pressure-fed to the vaporizer from the liquid receiving tank so that the gas pressure on the upstream side of the high-temperature type pressure type flow rate control device reaches a predetermined setting pressure or higher.

The invention according to a fifth embodiment further includes, in the invention according to the first embodiment, a temperature control device that adjusts a heating temperature of the vaporizer so that the pressure on the upstream side of the high-temperature type pressure type flow rate control device reaches a predetermined setting pressure or higher.

The invention according to a sixth embodiment is that, in the invention according to the first embodiment, the vaporizer is composed of the vaporizing chamber provided with a desired internal space volume, a plurality of orifices for dampening pulsation, which are arranged with spaces between them inside the vaporizing chamber, and heaters installed on the outer side surfaces of the vaporizing chamber.

The invention according to a seventh embodiment is that, in the invention according to the first embodiment, a relief valve is provided in a pipe passage between the vaporizer and the high-temperature type pressure type flow rate control device, wherein the relief valve operates to relieve pressure when the gas pressure in the pipe passage reaches an approximately predetermined maximum allowable working pressure of the high-temperature type pressure type flow rate control device.

The invention according to an eighth embodiment is that in the invention according to the first embodiment, high-temperature type pressure type flow rate control is performed by the gas supply apparatus so as to heat the device main body of the high-temperature type pressure type flow rate control device to a temperature of 20° C. to 250° C. by a heater.

The invention according to a ninth embodiment is that, in the invention according to the first embodiment, a heating temperature of the vaporizer is set to 20° C. to 250° C.

The invention according to a tenth embodiment is that, in the invention according to the first embodiment, a buffer tank is disposed in the pipe passage between the vaporizer and the high-temperature type pressure type flow rate control device.

The invention according to an eleventh embodiment is that, in the invention according to the six embodiment, the vaporizer is configured so that the vaporizing chamber of the vaporizer is a metal vaporizing chamber and is provided with heat equalizing plates on its outer side surfaces, and is further equipped with insulating materials on its outer sides.

The invention according to a twelfth embodiment is that, in the invention according to the six embodiment, the vaporizing chamber of the vaporizer is equipped with a pool part for liquid content existing in the vaporizing chamber.

The invention according to a thirteenth embodiment is that, in the invention according to the six embodiment, the metal vaporizing chamber is formed into a metal cylindrical vaporizing chamber, and the orifice for dampening pulsation is formed into a discoid shape, and the two orifices for dampening pulsation are arranged in parallel with a space inside the vaporizing chamber.

The invention according to a fourteenth embodiment is that, in the invention according to the six embodiment, the inside of the vaporizing chamber is filled with a heating accelerator made of steel balls and porous metal plates.

The invention according to a fifteenth embodiment is that, in the invention according to the eighth embodiment, aluminum heat equalizing plates are firmly fixed to the device main body of the high-temperature type pressure type flow rate control device, and sheath heaters are arranged at the vicinities of a passage on the side of a gas inlet and a passage on the side of a gas outlet of the device main body, to maintain a temperature difference between portions contacting the gas at 6° C. or less.

The invention according to a sixteenth embodiment is that, in the invention according to the eighth embodiment or the ninth embodiment, a heater configured so that a sheath heater with a desired length is inserted and fixed into a heater insertion groove formed in the inner side surface of an aluminum thick plate installed on both side surfaces of the high-temperature type pressure type flow rate control device, or on both side surfaces and bottom surface of the vaporizer.

Effects of the Invention

In the present invention, because a flow rate of a gas vaporized by the vaporizer is controlled by the high-temperature type pressure type flow rate control device that has stable flow rate control characteristics, even when the conditions on the side of the vaporizer fluctuate to a certain degree, the fluctuation does not have a considerable effect on its flow rate measurement accuracy on the side of the flow rate control device. As a result, even when temperature control accuracy, or pressure control (liquid inflow control) accuracy, on the side of the vaporizer is somewhat low or fluctuated to a certain degree, its flow rate control accuracy on the side of the gas does not deteriorate in any case, which makes it possible to stably perform highly accurate gas flow rate control.

Furthermore, because the internal space of the vaporizing chamber of the vaporizer is partitioned into a plurality of compartments provided with orifices for dampening pulsation, and because the pool part for liquid content remaining inside the vaporizing chamber is provided to discharge the liquid content in the pool part to the outside, pressure fluctuation in the vaporizing chamber due to the remaining liquid content is significantly reduced.

Moreover, the pressure of the supplying gas to the flow rate control device is stabilized by providing a buffer tank between the vaporizer and the high-temperature type pressure type flow rate control device. This makes it possible to perform further highly accurate gas flow rate control.

Because the vaporizing chamber is heated by the heaters and the heat equalizing plates are installed on the outer side surfaces of the vaporizing chamber, the vaporizing chamber is uniformly heated. This makes it possible to perform more stable vaporization of the liquid content.

Because the high-temperature type pressure type flow rate control device is set to 50° C. to 200° C. by cartridge heaters, and the aluminum heat equalizing plates are attached to the main body of the high-temperature type pressure type flow rate control device, and the auxiliary sheath heaters are installed in the passage on the side of the gas inlet and are installed on the passage on the side of the gas outlet, it is possible to maintain a temperature difference between portions contacting the gas at 6° C. or less. It is also possible to completely prevent the generation of a liquid content in the flow rate control device main body.

DESCRIPTION OF SYMBOLS

A: gas supply apparatus equipped with a vaporizer, T: liquid receiving tank, LG: liquid, G: gas, $V_1$: liquid supply rate control valve, $V_2$ to $V_7$: on-off valves, Q: liquid supply rate control device, M: heating temperature control device, L: relief valve, Gp: gas for pressurizing the liquid receiving tank, To: heater temperature detector, $P_0$ to $P_1$: pressure detectors, $T_1$: temperature detector, 1: vaporizer, 2: high-temperature type pressure type flow rate control device, 3: vaporizing chamber, 3a, 3b, 3c: block bodies, 3d: liquid inlet, 3e: gas outlet, 3f, 3g: heating accelerators, 4: orifice for dampening pulsation, 4a: orifice hole, 5: liquid pool part, 6 to 8: heating devices, 9: control valve, 9a: driving section, 9b: diaphragm valve body, 10: orifice, 11: buffer tank, 12: heat equalizing plate, 13: heater, 13a: aluminum plate, 13b: heater insertion groove, 13c: coil heater, 14: heat insulating material, 15: arithmetic control device, 15a: flow rate arithmetic section, 15b: comparison section, 15c: amplifier/AD converter, 15d: setting input section, 16: control device main body, 16a: gas outlet, 17: cartridge heater, 18: auxiliary sheath heater, 19: pipe passage, 20: process chamber, 21: vacuum pump, 22: orifice, 23: pipe passage.

DETAILED DESCRIPTION OF THE INVENTION

Best Mode for Carrying Out the Invention

Figure 1:
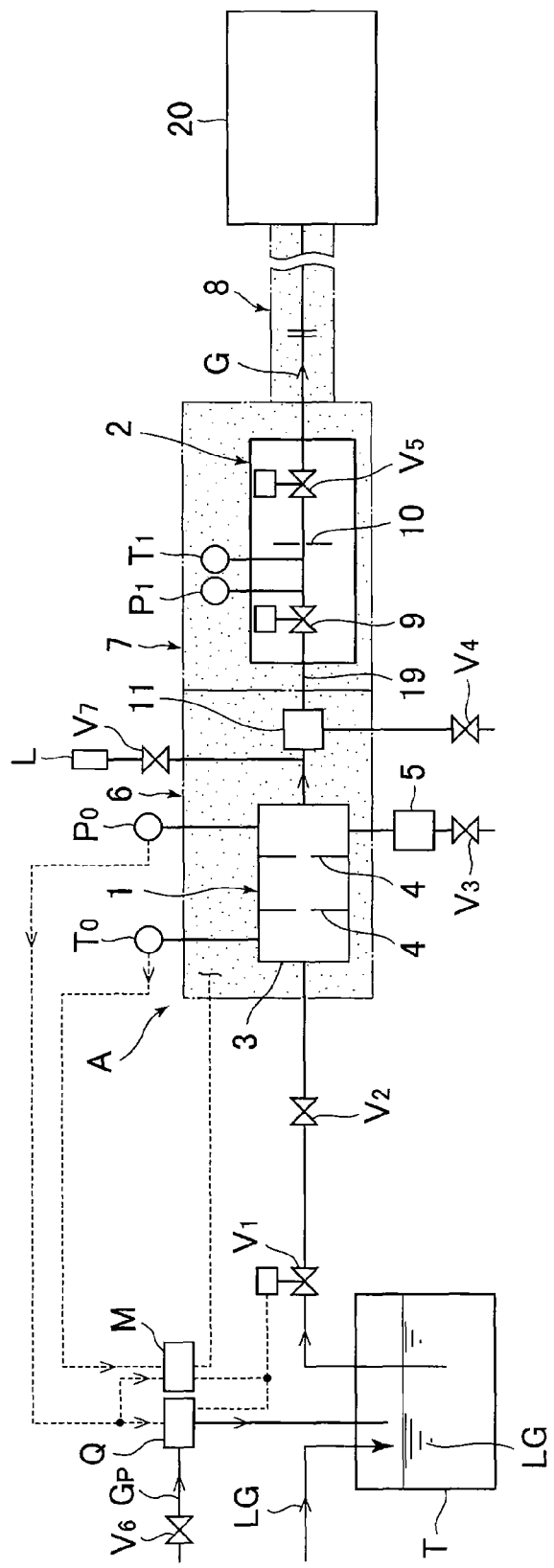
FIG. 1 is a basic block diagram schematically showing a gas supply apparatus A including a vaporizer according to the present invention.

Hereinafter, a nonlimiting embodiment of the present invention will be described with reference to the accompanying drawings. In the figures, like character references are employed to designate like parts. FIG. 1 is a block diagram showing a basic configuration of a gas supply apparatus A including a vaporizer according to the present invention. In FIG. 1, reference character T denotes a liquid receiving tank, reference character Q denotes a liquid supply rate control device, reference character M denotes a heating temperature control device, reference character $V_1$ denotes a liquid supply rate control valve, reference character L denotes a relief valve, reference character Gp denotes a gas for pressurizing the liquid receiving tank, reference character To denotes a heater temperature detector, reference characters $V_2$ to $V_7$ denote on-off valves, reference characters $P_0$ and $P_1$ denote pressure detectors, reference character $T_1$ denotes a temperature detector, reference numeral 1 denotes a vaporizer, reference numeral 2 denotes a high-temperature type pressure type flow rate control device, reference numeral 3 denotes a vaporizing chamber, reference numeral 4 denotes an orifice for dampening pulsation, reference numeral 5 denotes a liquid pool part, reference numerals 6 to 8 denote heating devices, reference numeral 9 denotes a control valve, reference numeral 10 denotes an orifice, reference numeral 11 denotes a buffer tank, reference numeral 19 denotes a pipe passage, and reference numeral 20 denotes a process chamber. In addition, the liquid pool part 5 and the buffer tank 11 may be eliminated in accordance with some embodiments of the invention.

The gas supply apparatus A equipped with the vaporizer of the present invention (hereinafter abbreviated to the "gas supply apparatus") is composed of the liquid receiving tank T, the liquid supply rate control device Q, the vaporizer 1, the high-temperature type pressure type flow rate control device 2 (hereinafter abbreviated to the "pressure type flow rate control device"), the heating devices 6, 7, and 8, and the like. The vaporizer 1, the pressure type flow rate control device 2, and the combined structure of both compose a substantial part of the present invention.

Figure 2:
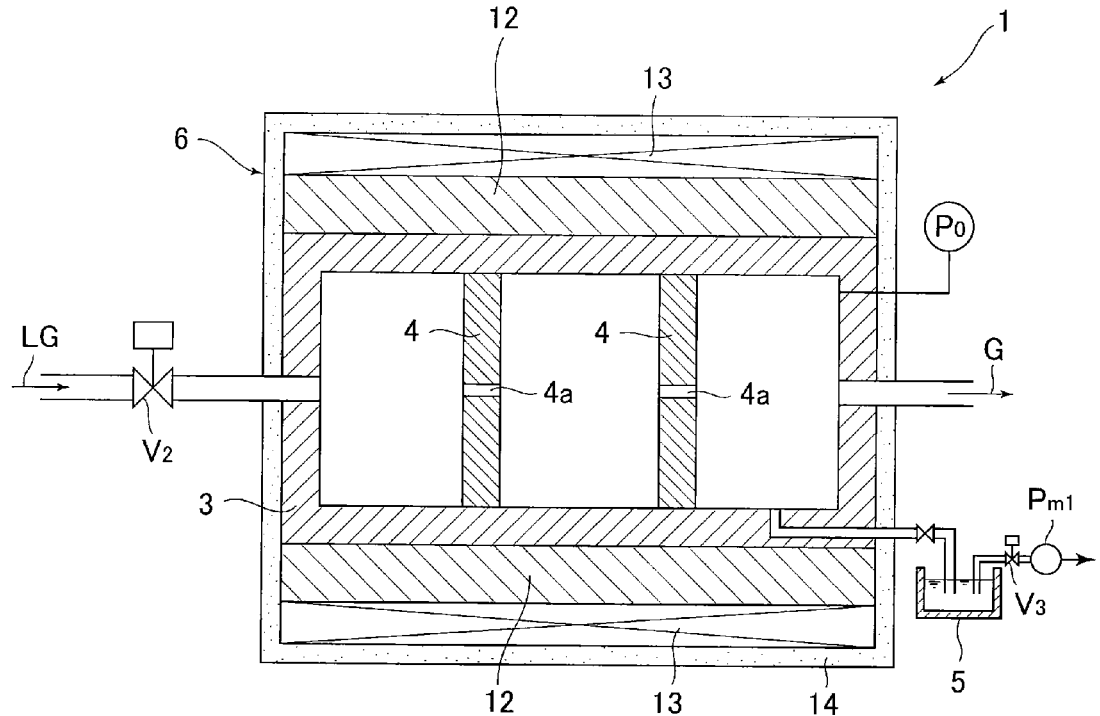
FIG. 2 is a cross-sectional schematic diagram of a vaporizer 1 used in the present invention.

FIG. 2 is a cross-sectional schematic diagram of the vaporizer 1 used for the present invention. The vaporizer 1 is composed of a case 3 (forming the vaporizing chamber), whose planar shape is quadrangular, and the two orifices for dampening pulsation 4, which partition the inside of the case 3 into three compartments, the liquid pool part 5, a drainage mechanism from the liquid pool part 5, aluminum heat equalizing plates 12 that are firmly fixed to both top and bottom surfaces and the front and rear side surfaces (not shown) of the vaporizing chamber 3, heaters 13 installed on the outer surfaces of the heat equalizing plates 12, with heat insulating materials 14 covering the outsides of the heaters 13. The vaporizer 1 also includes the pressure detector $P_0$, and the like.

The vaporizing chamber 3 is formed of stainless steel made into a case having an appropriate volume with an internal volume of 10 cm$^3$ or more, and a value of the internal volume is appropriately determined according to the type of liquid LG and a required gas flow rate. As will be described later, in the case where the liquid LG is purified water and the required gas flow rate is 100 Standard Cubic Centimeters per Minute (SCCM), the internal volume of the vaporizing chamber 3 is set to be approximately 18 cm$^3$. Furthermore, the orifice 4 for dampening pulsation, as well, is formed of stainless steel, and an inner diameter of its orifice hole 4a is appropriately specified according to the type of liquid LG or to the amount of liquid to be vaporized. In the case where the liquid LG is water and the required gas flow rate is 100 SCCM, the respective hole diameters of the two orifices 4 are set to 0.2 mmφ. Moreover, as shown in FIG. 2, the internal space of the vaporizing chamber 3 is partitioned into three compartments. However, the partitioning number for partitioning the chamber 3 into compartments is specified as 2 to 5 according to an allowable fluctuation width of inner pressure $P_0$ on the side of the outlet of the chamber 3. In other words, chamber 3 may be partitioned into two to five compartments.

The vaporizer 1 is heated to approximately 50° C. to 300° C. by the heating device 6 composed of the heaters 13, the aluminum heat equalizing plates 12, and the like, and the liquid is made into a gas G at a temperature of 20° C. to 250° C. so it may flow out toward the pressure type flow rate control device 2. In the vaporizer 1 of FIG. 2, the vaporizing chamber 3 is formed into a box shape. However, the vaporizing chamber 3 may be formed into a cylindrical shape, and the orifice 4 for dampening pulsation may be formed into a discoid shape, and a plurality of the orifices 4 are arranged in parallel with each other, and are welded so as to be fixed to the inner wall surface of the vaporizing chamber 3.

In the embodiment of FIG. 2, the inside of the vaporizing chamber 3 is made as a space portion other than the orifices 4, which form additional space portions. Meanwhile, in order to accelerate heating of liquid (i.e., liquefied gas) LG, and to maintain a temperature of a vaporized gas, a heating accelerator (not shown) composed of small diameter steel balls and a laminated body of porous metal plates may be supplied by desired amounts to the inside of the vaporizing chamber 3 in order to fill up the internal space of the vaporizing chamber 3. Furthermore, the liquid pool part 5 is provided on the side of the outlet of the vaporizing chamber 3 as shown in FIG. 2. Meanwhile, the liquid pool part 5 and the drainage mechanism may be omitted in accordance with some embodiments of the invention.

Figure 3:
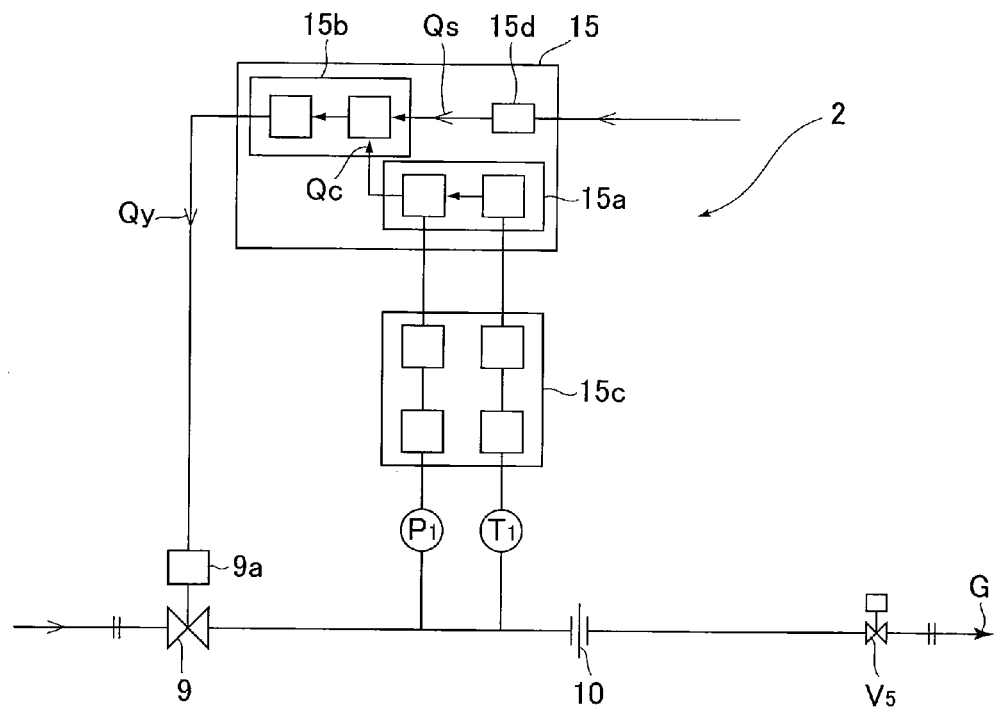
FIG. 3 is a basic block diagram schematically showing a high-temperature type pressure type flow rate control device 2 used in the present invention.

FIG. 3 is a basic block diagram of the high-temperature type pressure type flow rate control device 2 used in accordance with the present invention. In FIG. 3, reference numeral 9 denotes a control valve, reference numeral 9a denotes a driving section, reference numeral 10 denotes an orifice, and reference numeral 15 denotes an arithmetic control device. Detected values of the pressure detector $P_1$ and the temperature detector $T_1$ are input to a flow rate arithmetic section 15a through an amplifier/AD converter 15c, and a gas flow rate Qc passed through the orifice 10 is computed as $Qc=KP_1$, wherein K is a constant. Thereafter, when a setting flow rate value Qs outputted from a setting input section 15d and the computed flow rate value Qc are compared in a comparison section 15b, and a differential signal Qy between both is input from the comparison section 15b to the driving section 9a of the control valve 9, the control valve 9 is opened and closed in a direction that causes the differential signal Qy to become zero.

The pressure type flow rate control device 2 is based on the standard notion that it is possible to compute a gas flow rate Q passing through an orifice 10 as $Q=KP_1$ (K is a constant, and $P_1$ is pressure on the upstream side of the orifice) in the case of a fluid flow in a so-called "critical state" in which a gas flow velocity passing through the orifice 10 is faster than or equal to the sound velocity (i.e., the velocity of sound). Accordingly, its responsiveness for flow rate control is extremely high and stable, and the pressure type flow rate control device 2 has excellent control responsiveness and a high control accuracy, which are far superior to those of a thermal mass flow rate control device. Because a pressure type flow rate control device itself is publicly known from Japanese Published Unexamined Patent Application No. H8-338546 and other applications, a detailed description thereof will be omitted here.

Figure 4:
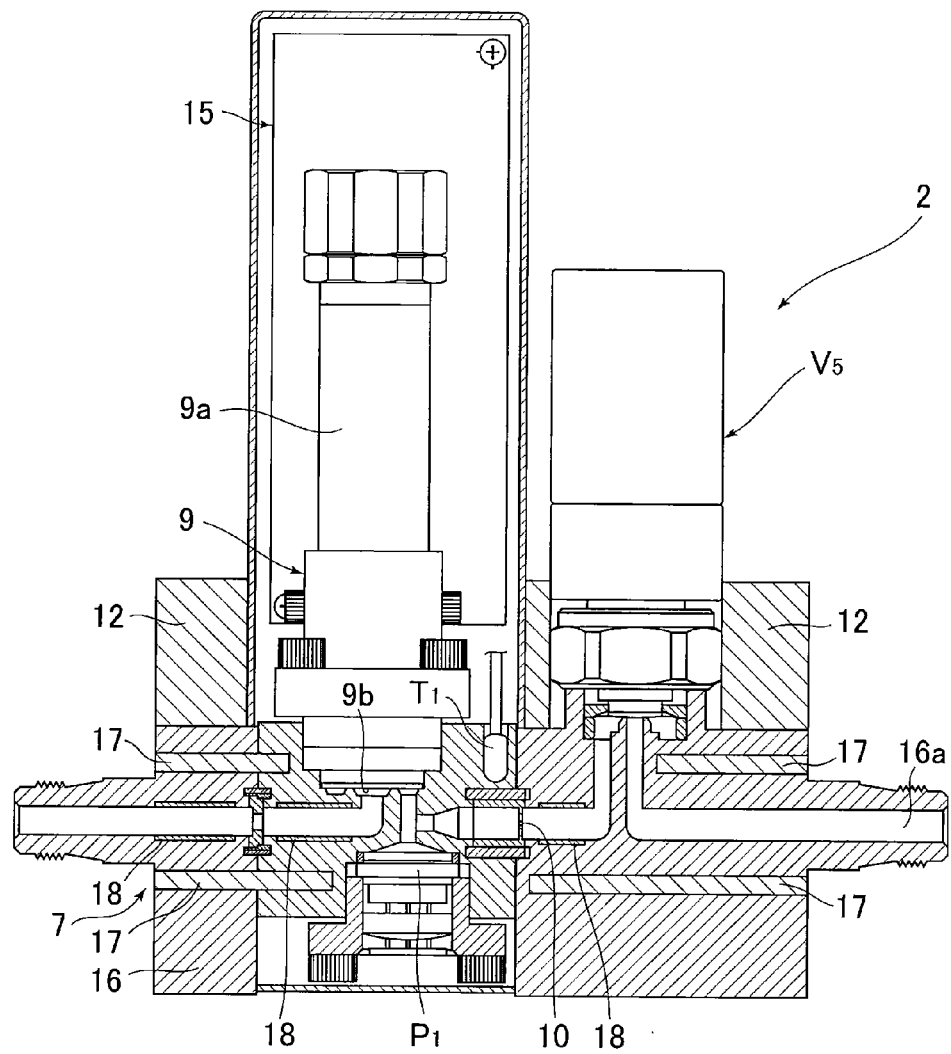
FIG. 4 is a cross-sectional schematic diagram of a control device main body portion of the high-temperature type pressure type flow rate control device 2 used in the present invention.

In addition, the control valve 9, the orifice 10, the pressure detector $P_1$, the temperature detector $T_1$, the arithmetic control device 15, and the like composing the high-temperature type pressure type flow rate control device 2 are, as shown in the schematic view of FIG. 4, all integrally assembled with a stainless steel device main body 16. That is to say that cartridge heaters 17 are inserted so as to be fixed to the device main body 16 (which may simply be referred to as "body"), and the device main body 16 and the portion of a diaphragm valve element 9b of the control valve 9 are heated to approximately 50° C. to 300° C. by the cartridge heaters 17.

Furthermore, auxiliary sheath heaters 18 are installed onto portions of the fluid passages formed in the device main body 16, and the vicinities of the inlet fluid passage and the outlet fluid passage are also heated by the auxiliary sheath heaters 18. As a result, in the case where a liquid LG is purified water ($H_2O$), hydrogen fluoride (HF), or tetraethoxysilane (TEOS.Si($OC_2H_5$)$_4$), the temperature of the passing gas G is maintained within a range of at least 20° C. to 250° C., then adhesion of liquid onto the diaphragm valve element 9b of the control valve 9 is completely prevented, and a difference between the gas temperatures in both fluid passages is maintained at approximately 6° C. or less. In addition, in accordance with the present invention, as liquid LG for the source of supply, there are trimethylindium (TMI.($CH_3$)$_3$In), dimethylzinc (DMZ.($CH_3$)$_2$Zn), diethylzinc (DEZ.($C_2H_5$)$_2$Zn), trimethylgallium (TMG.($CH_3$)$_3$Ga), triethylgallium (TEG.($C_2H_5$)$_3$Ga), trimethylaluminum (TMA.($CH_3$)$_3$Al), triethylaluminum (TEA.($C_2H_5$)$_3$Al), tetrakis(diethylamino)hafnium (TDEAH.Hf[N($C_2H_5$)$_2$]$_4$), tetrakis(ethylmethylamino)hafnium (Hf[N($CH_3$)($C_2H_5$)]$_4$), tetrakis(ethylmethylamino)zirconium (TEMAZ.(Zr[N($CH_3$)($C_2H_5$)]$_4$), tantalum penta-ethoxide (TAETO.Ta($C_2H_5$)$_5$), tri(dimethylamino)silane (TDMAS.SiH[N($CH_3$)$_2$]$_3$, trimethylsilane (3MS.($CH_3$)$_3$SiH), tetramethylsilane (4MS.($CH_3$)$_4$Si), bis(tert-butylamino)silane (BTBAS.$H_2$Si[NH(t-$C_4H_9$)]$_2$), triethyl phosphate (TEPO.O($C_2H_5O$)$_3$), triethyl borate (TEB.B($OC_2H_5$)$_3$), titanium tetrachloride (TiCl$_4$), and the like, which are suitable to use.

Moreover, the relatively thick aluminum heat equalizing plates 12 are firmly fixed to the top surface side and both front and rear side surfaces (not shown) of the apparatus main body 16, and temperatures of the respective parts of the control device main body 16 are made uniform by the heat equalizing plates 12. As shown in FIG. 4, the heating device 7 of the pressure type flow rate control device 2 is composed of the cartridge heaters 17 and the auxiliary sheath heaters 18. In addition, it is a matter of course that heaters to be used in the present invention may be of any type and in any mode of usage.

Figure 5:
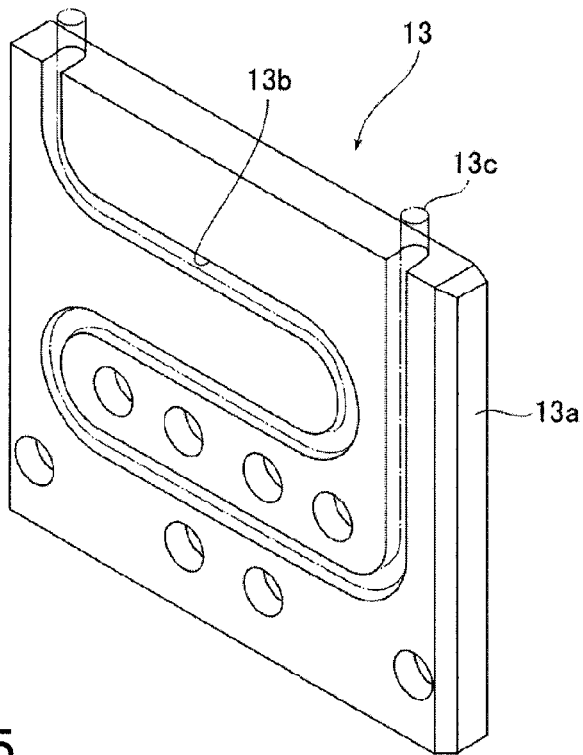
FIG. 5 shows a schematic perspective view of a heater 13 according to an embodiment of the invention.

FIG. 5 is a schematic perspective view of the heater 13 used in accordance with the present invention (See FIG. 2 as well). The heater 13 is configured so that a heater insertion groove 13b is provided in the inner side surface of a quadrangular aluminum plate 13 provided with a thickness of 4 to 8 mm, and a linear coil heater 13c is inserted and fixed into the heater insertion groove 13b.

Figure 6:
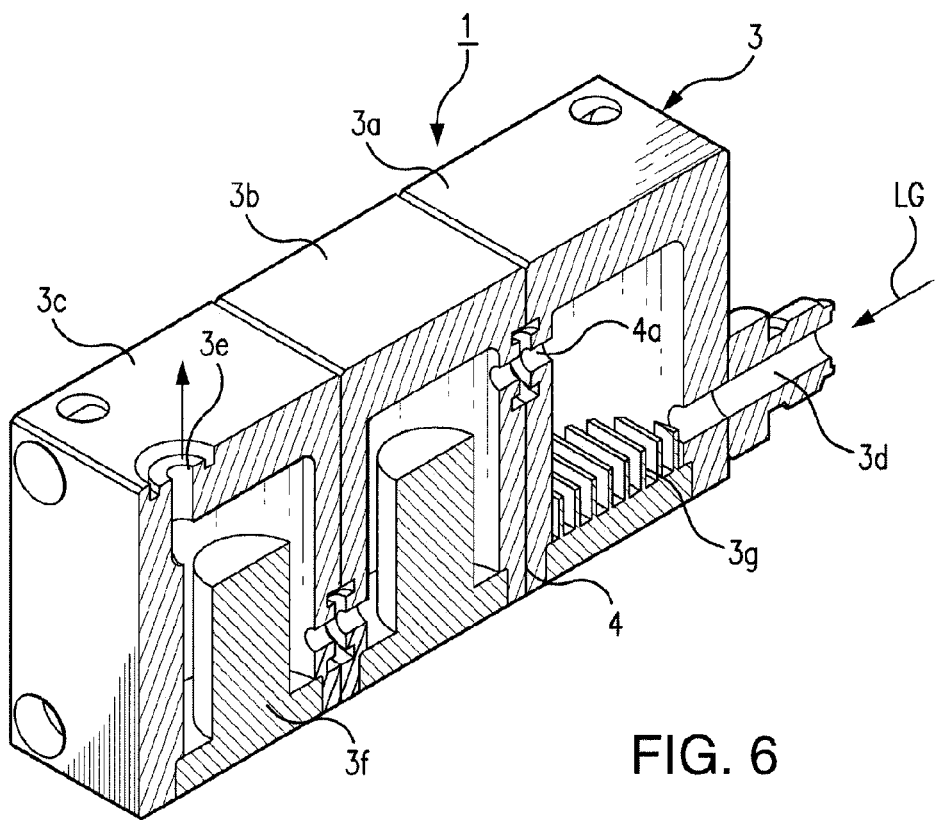
FIG. 6 is a partially cutaway schematic perspective view of a vaporizing chamber 3 according to another embodiment of the present invention.

FIG. 6 is a partially cutaway schematic perspective view of the vaporizer according to another embodiment of the present invention. The vaporizing chamber 3 is formed so that three block bodies 3a, 3b, and 3c are assembled in an airtight manner, and the liquid LG fed into the vaporizer from a liquid inlet 3d is vaporized, while passing of the liquid LG through the orifice holes 4a of the orifices 4 to flow out of a gas outlet 3e. Reference numerals 3f and 3g denote heating accelerators composed of small diameter steel balls and a laminated body of porous metal plates.

Figure 6A:
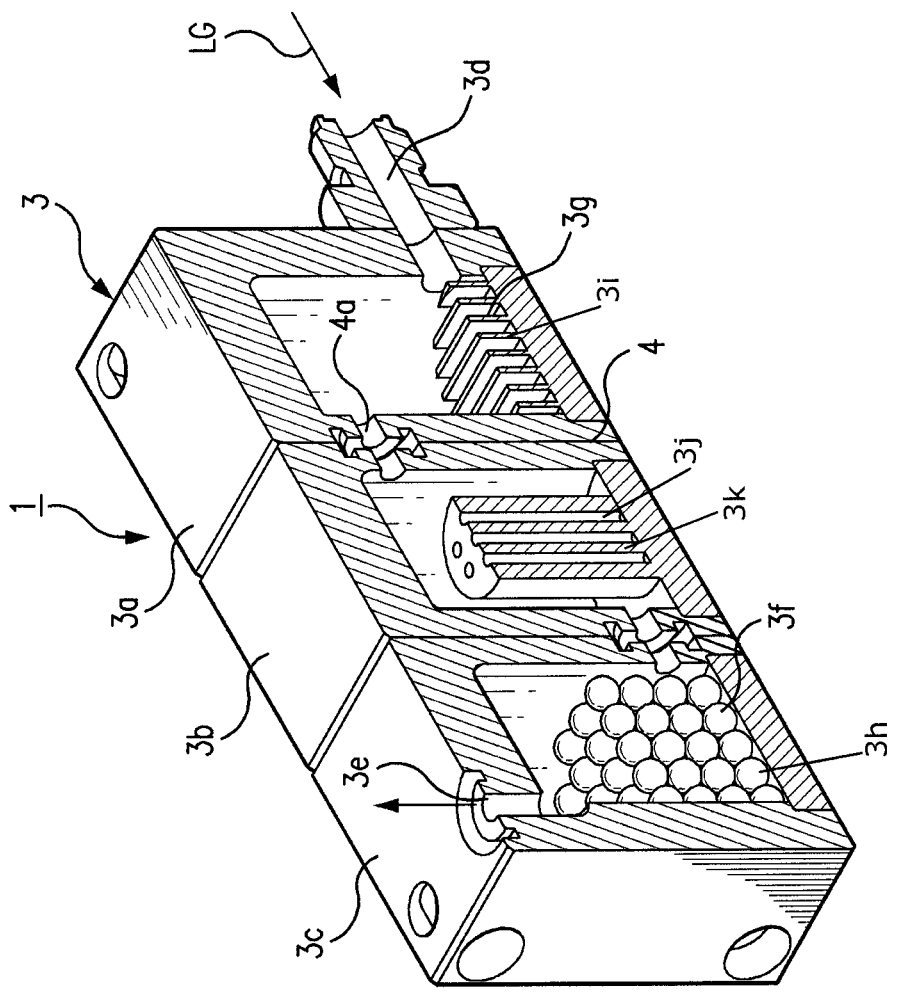
FIG. 6a is a partially cutaway schematic perspective view of a vaporizing chamber 3 showing steel balls and porous metal plates in accordance with the present invention.

FIG. 6a is a partially cutaway schematic perspective view of a vaporizing chamber 3 showing the heating accelerator 3f made up of steel balls 3h. The heating accelerator 3g is shown made up of porous plates 3i. Located between the heating accelerators 3f and 3g is heat accelerator 3j made up of porous plates 3k.

Figure 7:
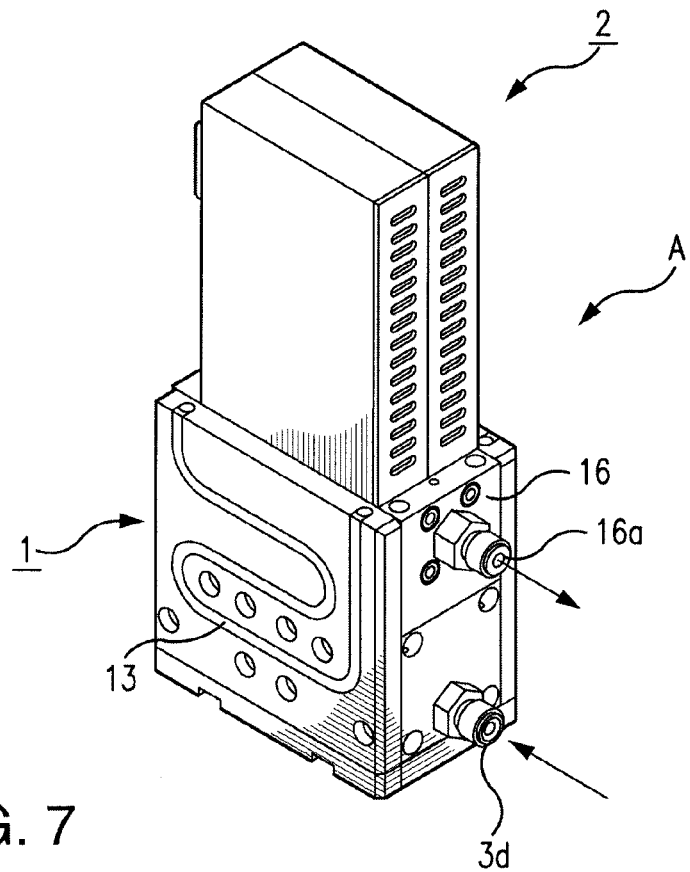
FIG. 7 is a schematic perspective view of a gas supply apparatus A, including a vaporizer, according to an embodiment of the present invention.

FIG. 7 is a schematic perspective view showing an embodiment of the gas supply apparatus A equipped with the vaporizer according to the present invention. The gas supply apparatus A is configured so that the high-temperature type pressure type flow rate control device 2 is mounted on the vaporizer 1 as shown in FIG. 6. Moreover, the plate-like heaters 13 shown in FIG. 5 are installed on both side surfaces and bottom surface of the vaporizer 1 and on the device main body 16 of the high-temperature type pressure type flow rate control device 2 so as to heat these structures. Reference numeral 16a in FIG. 7 denotes a gas outlet. However, an illustration of the outermost heat insulating material is omitted. The outermost heat insulating material 14 is shown in FIG. 2 and may be applied to the embodiment of FIG. 7.

Next, a general description of the operation in the present invention will be described. Referring to FIG. 1, a supply rate of the liquid LG from the inside of the liquid receiving tank T is controlled by adjusting the inner pressure in the tank T and the opening degree of the liquid supply rate control valve $V_1$ via the liquid supply rate control device Q, and a supply rate of the liquid LG is controlled such that the gas pressure on the upstream side of the high-temperature type pressure type flow rate control device 2 is set to a predetermined pressure value or greater by a signal from the pressure detector $P_0$ disposed on the outlet side of the vaporizer 1. In the same way, input to the heaters 13 of the heating device 6 and adjustment of an opening degree of the liquid supply rate control valve $V_1$ are performed via the heating temperature control device M by a signal from a heating temperature detector To of the vaporizer 1, and the gas pressure on the upstream side of the high-temperature type pressure type flow rate control device 2 is controlled so as to be set to a desired flow rate and pressure value or greater by the liquid supply rate control device Q and the heating temperature control device M.

The relief valve L is provided in the pipe passage through which the vaporizer 1 and the high-temperature type pressure type flow rate control device 2 communicate with each other. Thus, in the case wherein gas pressure on the outlet side of the vaporizer 1 rises abnormally, the gas G is discharged to the outside to relieve gas pressure.

Furthermore, the buffer tank 11 shown in FIG. 1 stores a predetermined volume of the gas G to prevent a significant fluctuation in flow rate (pressure) of the gas G flowing into the pressure type flow rate control device 2. Because the pressure type flow rate control device 2 is excellent in responsiveness as described above, even when there is a certain fluctuation in flow rate (pressure) of the outflow gas G from the vaporizer 1, no trouble is brought about in the flow rate control itself. Therefore, the volume of the buffer tank 11 may be small, or in place of the buffer tank 11 a vent line (not shown) may be provided in a branched manner in the pipe passage 19 (i.e., the vent line may be connected to the pipe passage 19).

Embodiment 1

Figure 8:
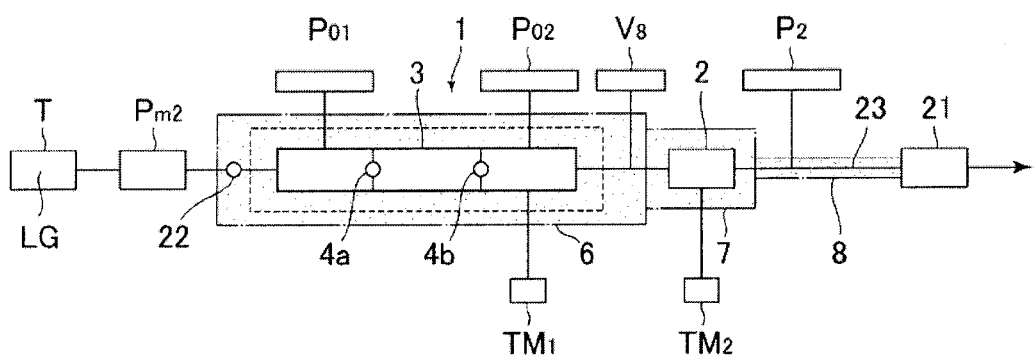
FIG. 8 is an explanatory diagram of a vaporization experiment by a vaporizer 1 according to the present invention.

FIG. 8 is an explanatory diagram for a water vaporization experiment using the vaporizer 1 (whose internal volume is approximately 18 cm$^3$) according to the present invention. The purified water LG in the tank T was pressure-injected into the vaporizing chamber 3 of the vaporizer 1 through an orifice 22 of size/diameter $\phi=0.8$ mm by a pump $Pm_2$, and heated by the heating device 6 composed mainly of an I/H heater 13 through the orifice 4a of size/diameter $\phi=0.2$ mm and the orifice 4b of size/diameter $\phi=0.2$ mm, and the vaporized gas (steam gas) G was passed through the high-temperature type pressure type flow rate control device 2 at a flow rate of 100 SCCM. In addition, the terminal end of a pipe passage 23 on the outlet side of the pressure type flow rate control device 2 was vacuumed by a scroll pump type vacuum pump 21.

The heating device 7 of the high-temperature type pressure type flow rate control device 2 is composed mainly of the cartridge heaters 17 (see, e.g., FIG. 4), and the heating device 8 of the pipe passage 23, and the like, is composed mainly of a rubber heater.

First, the I/H heater of the heating device 6, the cartridge heaters of the heating device 7, and the rubber heater of the heating devices 8 are operated, and it is confirmed that the temperature of the vaporizing chamber 3 is stabilized after preheating of the I/H heater. Thereafter, the supply of the purified water LG was started, and supply of the purified water LG continued until the inner pressure of the vaporizing chamber 3 was maintained at 140 kPa to 160 kPa, and thereafter passed through the pressure type flow rate control device 2. A setting flow rate of the pressure type flow rate control device 2 is 100 SCCM. Furthermore, flow rate adjustment of the pump $Pm_2$ was performed so as to maintain the inner pressure of the vaporizing chamber 3 at 140 kPa to 160 kPa. Moreover, the setting pressure at the time of opening the vent valve $V_8$ was set to 300 kPa.

In the above-described experimental state, respectively, the pressures in the vaporizing chamber 3 were measured by the pressure detectors $P_{O1}$ and $P_{O2}$, the pressure in the pipe passage 23 was measured by the pressure detector $P_2$, the temperature in the vaporizing chamber 3 was measured by the temperature detector $TM_1$, and the outer surface temperature of the control device main body 16 was measured by the temperature detector $TM_2$.

[Experiment 1]

Figure 9:
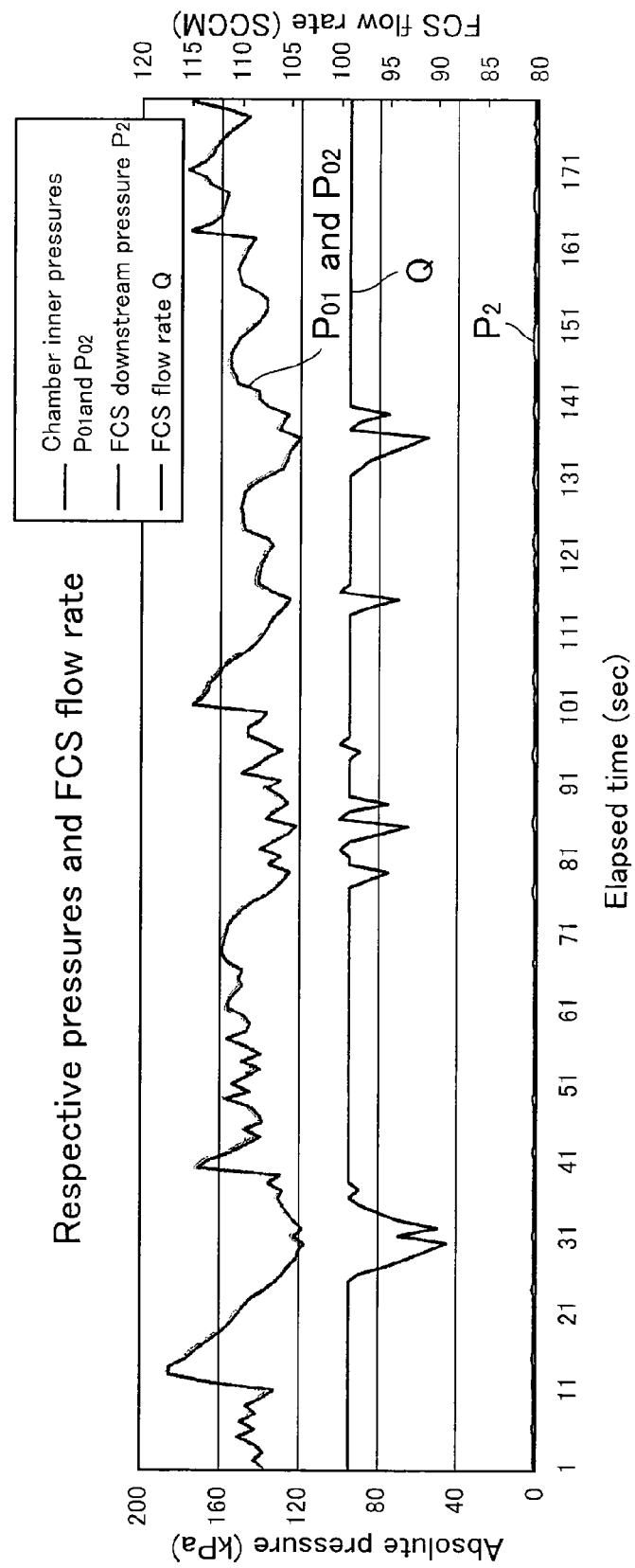
FIG. 9 is a graph showing a relationship between elapsed times and pressures of respective parts of the gas supply apparatus in Experiment 1.
Figure 10:
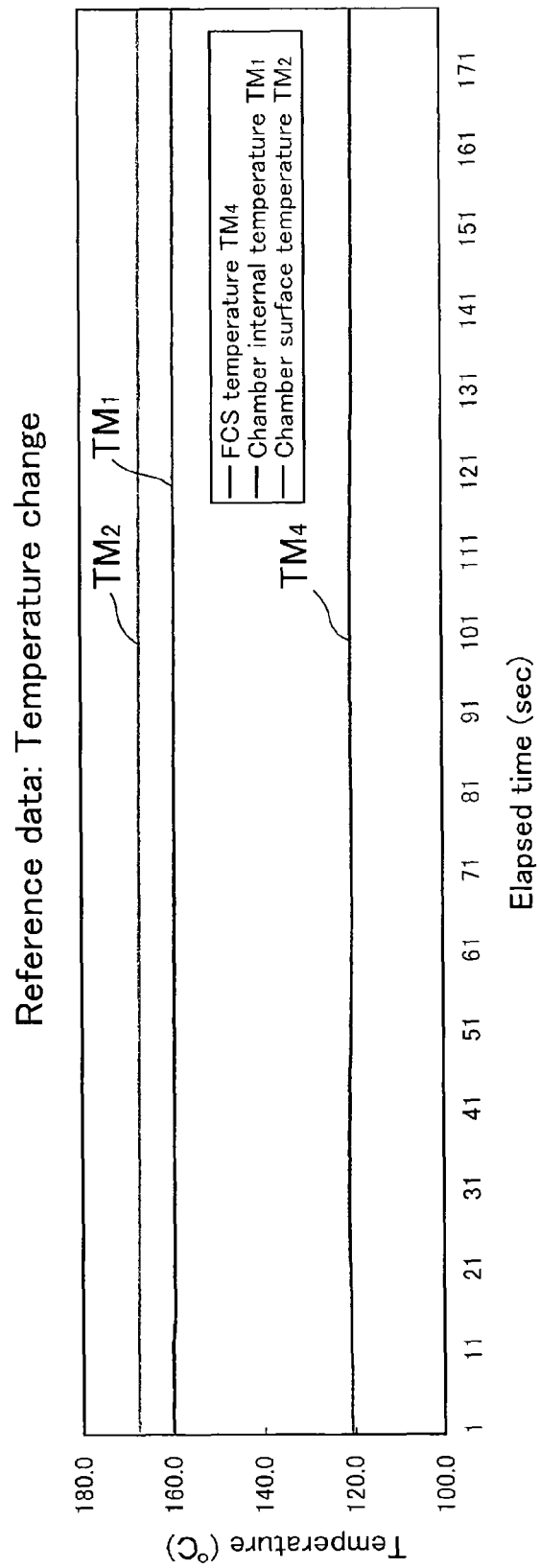
FIG. 10 is a graph showing a relationship between elapsed times and flow rates of a high-temperature type pressure type flow rate control device in Experiment 1.

A first vaporization experiment of the purified water LG was performed under the condition that the setting temperature of the heating device 6 (e.g., I/H heater 13) of the vaporizer is 160° C., the flow rate of the pump $Pm_2$ for pressure-feeding liquid is 0.58 cc/min, the setting flow rate of the pressure type flow rate control device 2 is 100 sccm, and the setting temperature of the heating device 7 (i.e., the cartridge heaters 17) of the pressure type flow rate control device 2 is 120° C. FIGS. 9 and 10 show the results of Experiment 1. Respectively, FIG. 9 shows the relationship between elapsed times, pressures of the respective parts of the system (i.e., chamber inner pressures, and FCS downstream pressure), and flow rates of the pressure type flow rate control device, and FIG. 10 shows the relationship between elapsed times and temperatures of the respective parts of the system (i.e., chamber internal temperature and chamber surface temperature).

[Experiment 2]

Figure 11:
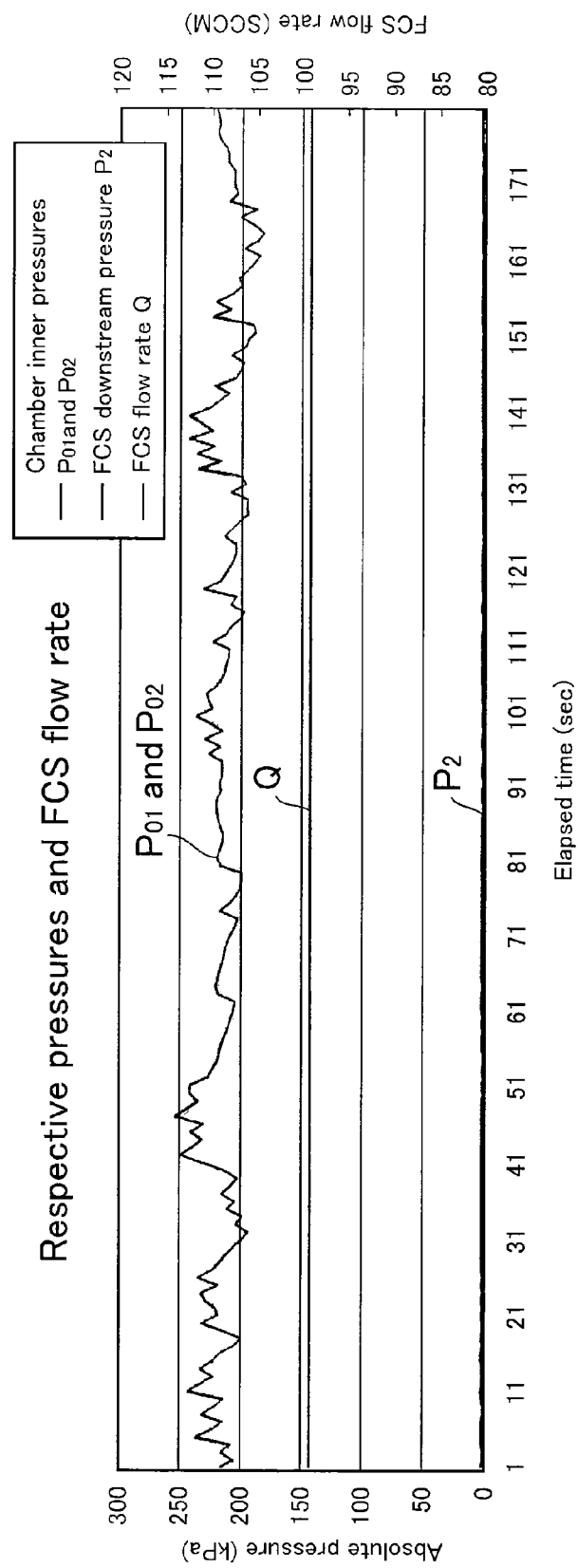
FIG. 11 is a graph showing a relationship between elapsed times, pressures of the respective parts of the gas supply apparatus, and flow rates of a pressure type flow rate control device in Experiment 2.
Figure 12:
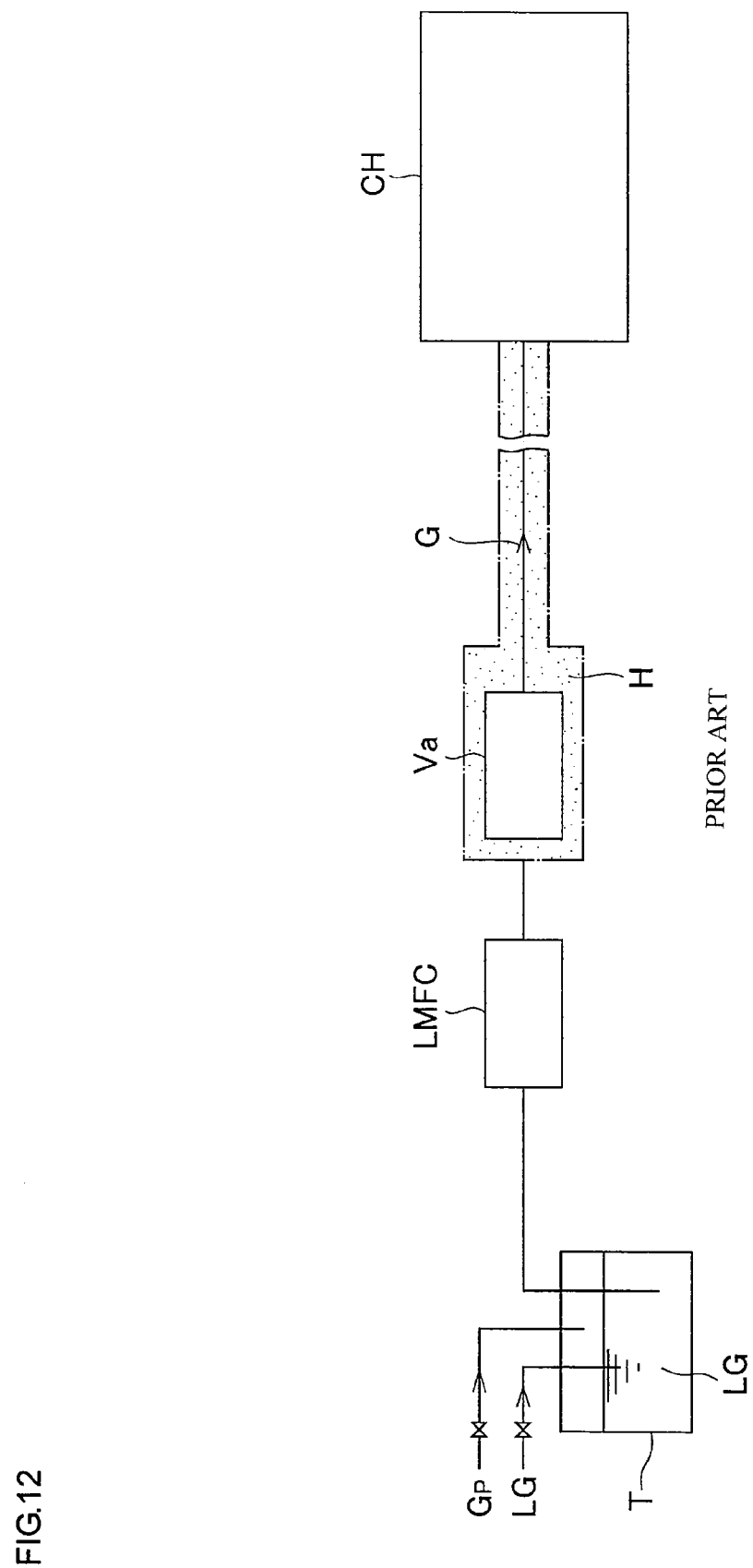
FIG. 12 is an explanatory diagram showing an example of a gas supply apparatus including a conventional vaporizer.
Figure 13:
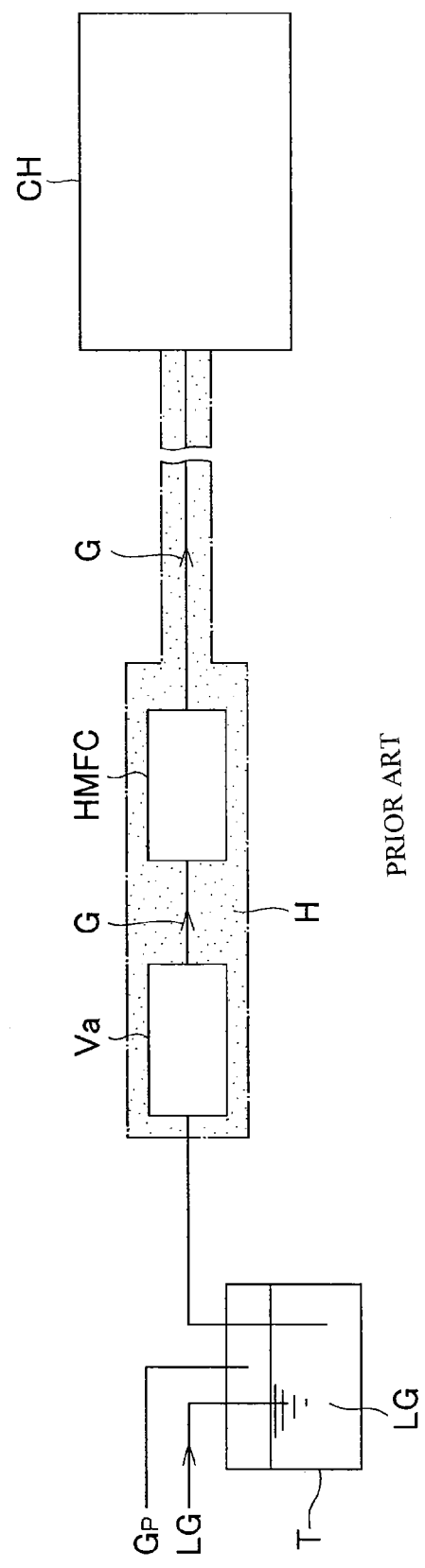
FIG. 13 is a diagram showing another example of a gas supply apparatus including a conventional vaporizer.

Another vaporization experiment of the purified water LG was performed under the condition that the setting temperature of the heating device 6 (e.g., I/H heater 13) of the vaporizer is 160° C., the flow rate of the pump $Pm_2$ for pressure-feeding liquid is 0.63 cc/min, the setting flow rate of the pressure type flow rate control device 2 is 100 sccm, and the setting temperature of the heating device 7 (i.e., the cartridge heaters 17) of the pressure type flow rate control device 2 is 120° C. FIG. 11 shows the experimental results for Experiment 2, and shows the elapsed times, the pressures of the respective parts of the system (i.e., chamber inner pressures and downstream pressure), and the flow rates of the pressure type flow rate control device.

From the above-described experimental results, it has been understood that: (a) although a pressure fluctuation is slightly brought about in response to the supply of a specific amount of the liquid LG, it is possible to maintain the supply at a stable flow rate by maintaining the pressure in the vaporizing chamber at approximately 150 kPa or more;

(b) in the case where the liquid LG is water, the setting temperature of the vaporizing chamber 3 is approximately 160° C., which is sufficient, and when the gas pressure on the outlet side of the vaporizing chamber 3 is 140 kPa or more, it is possible for the pressure type flow rate control device 2 to perform the flow rate control at a constant flow rate regardless of a fluctuation in pressure on the upstream side;

(c) it is better to control the pressure in the vaporizing chamber 3 than to control the supply rate of the liquid LG and, therefore, it is preferable that a mechanism for immediately returning released gas to the liquid tank T is provided; and (d) because water cooled in the pipe part so as to be liquefied drops into the vaporizing chamber 3 and causes unstable pressure, it is necessary to take heed of shortening and heating of the pipe on the outlet side of the vaporizing chamber 3.

INDUSTRIAL APPLICABILITY

The present invention may be applied to gas supply apparatuses using liquefied gas in all kinds of industries including semiconductor manufacturing, the chemical industry, the medical industry, and the food industry. Furthermore, the present invention may be applied to gas supply apparatuses using all kinds of liquids vaporized by warming as source materials, in addition to water and liquefied gas for semiconductor manufacturing.

The invention claimed is:

1. A gas supply apparatus equipped with a vaporizer, the gas supply apparatus comprising:
   (a) a liquid receiving tank;
   (b) a vaporizer disposed to vaporize liquid pressure-fed from the liquid receiving tank to the vaporizer;
   (c) a high-temperature type pressure type flow rate control device disposed to adjust a flow rate of outflow gas from the vaporizer, wherein the high-temperature type pressure type flow rate control device comprises a control valve, a driving section, an orifice, an arithmetic control device, a pressure detector and a temperature detector;
   (d) a plurality of heating devices disposed to heat the vaporizer, the high-temperature type pressure type flow rate control device, and portions of pipe passages connected to the vaporizer and to the high-temperature type pressure type flow rate control device;
   (e) a liquid supply control device disposed to adjust an amount of liquid to be pressure-fed to the vaporizer from the liquid receiving tank so that gas pressure on an upstream side of the high-temperature type pressure type flow rate control device reaches a predetermined setting pressure or higher; and
   (f) a temperature control device disposed to adjust a heating temperature of the vaporizer so that the gas pressure on the upstream side of the high-temperature type pressure type flow rate control device reaches the predetermined setting pressure or higher.

2. The gas supply apparatus equipped with the vaporizer according to claim 1, wherein the liquid is selected from the group consisting of water, hydrogen fluoride, tetraethoxysilane, trimethylaluminum, and tetrakis(diethylamino) hafnium.

3. The gas supply apparatus equipped with the vaporizer according to claim 1, wherein a device main body of the high-temperature type pressure type flow rate control device is mounted on a vaporizing chamber of the vaporizer.

4. The gas supply apparatus equipped with the vaporizer according to claim 3, wherein high-temperature type pressure type flow rate control is performed by the gas supply apparatus so that a first heating device heats the device main body of the high-temperature type pressure type flow rate control device to a temperature of 20° C. to 250° C.

5. The gas supply apparatus equipped with the vaporizer according to claim 4, wherein aluminum heat equalizing plates are firmly fixed to the device main body of the high-temperature type pressure type flow rate control device, and sheath heaters are arranged in a vicinity of a first passage disposed on a side of a gas inlet and a second passage on a side of a gas outlet of the device main body in order to maintain a temperature difference between portions of the first passage and the second passage contacting gas at 6° C. or lower.

6. The gas supply apparatus equipped with the vaporizer according to claim 4, wherein a second heating device is configured as a sheath heater provided with a desired length, wherein the sheath heater is inserted and fixed into a heater insertion groove formed in a inner side surface of an aluminum thick plate arranged at both side surfaces of the high-temperature type pressure type flow rate control device, or the sheath heater is inserted and fixed into the heater insertion groove formed in the inner side surface of the aluminum thick plate arranged at both side surfaces and bottom surface of the vaporizer.

7. The gas supply apparatus equipped with the vaporizer according to claim 1, wherein the vaporizer comprises
   i. a vaporizing chamber provided with an internal space volume;
   ii. a plurality of orifices for dampening pulsation, wherein the plurality of orifices are arranged with spaces between each other and the plurality of orifices are disposed inside the vaporizing chamber; and
   iii. a plurality of heaters disposed on outer side surfaces of the vaporizing chamber.

8. The gas supply apparatus equipped with the vaporizer according to claim 7, wherein the vaporizing chamber of the vaporizer is a metal vaporizing chamber that is provided with heat equalizing plates disposed on outer side surfaces of the metal vaporizing chamber, and the vaporizer is further equipped with insulating materials disposed on outer sides of the vaporizer.

9. The gas supply apparatus equipped with the vaporizer according to claim 7, wherein the vaporizing chamber of the vaporizer is equipped with a pool part disposed to discharge liquid content existing in the vaporizing chamber.

10. The gas supply apparatus equipped with the vaporizer according to claim 7, wherein the vaporizing chamber of the vaporizer is a metal vaporizing chamber formed into a metal cylindrical vaporizing chamber, and each orifice for dampening pulsation is formed into a discoid shape, and wherein the plurality of orifices include two orifices for dampening pulsation that are arranged in parallel with a first space disposed inside the vaporizing chamber.

11. The gas supply apparatus equipped with the vaporizer according to claim 7, wherein an inside portion of the vaporizing chamber is filled with a heating accelerator comprising steel balls and porous metal plates.

12. The gas supply apparatus equipped with the vaporizer according to claim 1, wherein a relief valve is provided in a first pipe passage disposed between the vaporizer and the high-temperature type pressure type flow rate control device, wherein the relief valve operates to relieve pressure when gas pressure in the first pipe passage reaches an approximately predetermined maximum allowable working pressure of the high-temperature type pressure type flow rate control device.

13. The gas supply apparatus equipped with the vaporizer according to claim 1, wherein a heating temperature of the vaporizer is set to 20° C. to 250° C.

14. The gas supply apparatus equipped with the vaporizer according to claim 13, wherein a second heating device is configured as a sheath heater provided with a desired length, wherein the sheath heater is inserted and fixed into a heater insertion groove formed in a inner side surface of an aluminum thick plate arranged at both side surfaces of the high-temperature type pressure type flow rate control device, or the sheath heater is inserted and fixed into the heater insertion groove formed in the inner side surface of the aluminum thick plate arranged at both side surfaces and bottom surface of the vaporizer.

15. The gas supply apparatus equipped with the vaporizer according to claim 1, wherein a buffer tank is disposed in a first pipe passage disposed between the vaporizer and the high-temperature type pressure type flow rate control device.

* * * * *